(12) United States Patent
Quarfoth

(10) Patent No.: US 11,710,898 B1
(45) Date of Patent: Jul. 25, 2023

(54) ELECTRONICALLY-SCANNED ANTENNAS WITH DISTRIBUTED AMPLIFICATION

(71) Applicant: HRL Laboratories, LLC, Malibu, CA (US)

(72) Inventor: Ryan G. Quarfoth, Los Angeles, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 364 days.

(21) Appl. No.: 16/888,276

(22) Filed: May 29, 2020

(51) Int. Cl.
| | | |
|---|---|---|
| *H03F 3/19* | (2006.01) | |
| *H01Q 5/00* | (2015.01) | |
| *H01Q 3/36* | (2006.01) | |
| *H03G 3/30* | (2006.01) | |
| *H01Q 9/04* | (2006.01) | |
| *H01Q 21/08* | (2006.01) | |

(52) U.S. Cl.
CPC ............. *H01Q 3/36* (2013.01); *H01Q 9/0407* (2013.01); *H01Q 21/08* (2013.01); *H03F 3/19* (2013.01); *H03G 3/3036* (2013.01); *H03F 2200/451* (2013.01); *H03G 2201/103* (2013.01)

(58) Field of Classification Search
CPC ........ H01Q 3/36; H01Q 9/0407; H01Q 21/08; H03G 3/3036; H03G 2201/103; H03F 2200/451
See application file for complete search history.

(56) References Cited

U.S. PATENT DOCUMENTS

| | | | |
|---|---|---|---|
| 1,381,089 | A | 6/1921 | Beverage |
| 2,402,622 | A | 6/1946 | Hansen |
| 6,366,238 | B1 | 4/2002 | DeMore et al. |
| 7,071,888 | B2 | 7/2006 | Sievenpiper |
| 7,245,269 | B2 | 7/2007 | Sievenpiper et al. |
| 7,889,135 | B2 | 2/2011 | Blaser et al. |
| 8,436,785 | B1 | 5/2013 | Lai et al. |
| 9,455,495 | B2 | 9/2016 | Gregoire |
| 9,466,887 | B2 | 10/2016 | Gregoire et al. |
| 9,698,479 | B2 | 7/2017 | Gregoire et al. |

(Continued)

FOREIGN PATENT DOCUMENTS

| | | | |
|---|---|---|---|
| EP | 0613245 B1 | 7/1997 | |
| EP | 2976809 | * 3/2013 | ............. H01Q 23/00 |

(Continued)

OTHER PUBLICATIONS

H.H. Beverage, et al, "The Wave Antenna A New Type of Highly Directive Antenna," Transactions of the American Institute of Electrical Engineers, vol. XLII, 1923, entire document.

(Continued)

*Primary Examiner* — Diane L Lo
*Assistant Examiner* — Abusayeed M Haque
(74) *Attorney, Agent, or Firm* — Ladas & Parry, LLP

(57) ABSTRACT

An electronically scanned antenna comprising a travelling wave guiding structure having a bottom conductor and a top conductor developing each along a first direction, the top conductor comprising a plurality of first conductive patches arranged periodically along said first direction and connected in series by tuning circuits; the electronically scanned antenna further comprising a plurality of amplifiers arranged for compensating resistive and radiation losses along the length of the travelling wave guiding structure.

20 Claims, 12 Drawing Sheets

(56) References Cited

U.S. PATENT DOCUMENTS

| | | | |
|---|---|---|---|
| 9,760,750 B1* | 9/2017 | Fink | G06K 19/07773 |
| 9,871,293 B2 | 1/2018 | Patel et al. | |
| 10,707,577 B1* | 7/2020 | Matland | H04B 7/0617 |
| 2010/0013728 A1* | 1/2010 | Harak | H01Q 1/04 |
| | | | 343/898 |
| 2011/0051561 A1* | 3/2011 | Fujisawa | G04R 20/04 |
| | | | 368/47 |
| 2014/0078007 A1* | 3/2014 | Abe | H01Q 9/0471 |
| | | | 343/702 |
| 2015/0318618 A1* | 11/2015 | Chen | H01P 7/082 |
| | | | 343/750 |
| 2018/0254555 A1* | 9/2018 | Sotoma | H01Q 25/00 |
| 2019/0036220 A1* | 1/2019 | Paulotto | H01Q 9/045 |
| 2021/0029731 A1* | 1/2021 | Kundu | H04W 72/02 |
| 2021/0265729 A1* | 8/2021 | Pond | H04B 7/0617 |

FOREIGN PATENT DOCUMENTS

| | | | | |
|---|---|---|---|---|
| EP | 2976809 A1 * | 1/2016 | | H01Q 23/00 |
| WO | WO-2015195718 | * 12/2015 | | H01Q 1/24 |
| WO | WO-2015195718 A1 * | 12/2015 | | H01P 1/165 |

OTHER PUBLICATIONS

D.R. Jackson, et al, "Leaky-Wave Antennas," Proceedings of the IEEE, Jul. 2012, entire document.

C. Caloz, et al., "CRLH Metamaterial Leaky-Wave And Resonant Antennas," IEEE Antennas and Propagation Magazine, Oct. 2008, entire document.

D. Sievenpiper, et al, "Holographic Artificial Impedance Surfaces for Conformal Antennas," 2005 IEEE Antennas and Propagation Society International Symposium, 2005, entire document.

B. H. Fong, et. al, "Scalar and Tensor Holographic Artificial Impedance Surfaces," IEEE Transactions on Antennas and Propagation, Oct. 2010, entire document.

D. Sievenpiper, et. al, "A steerable leaky-wave antenna using a tunable impedance Ground plane," IEEE Antennas and Wireless Propagation Letters, 2002, entire document.

J. S. Colburn, et. al, "Adaptive Artificial Impedance Surface Conformal Antennas," 2009 IEEE Antennas and Propagation Society International Symposium, Jun. 2009, entire document.

D. J. Gregoire, et. al, "An electronically-steerable artrficial-impedance-surface antenna," 2014 IEEE Antennas and Propagation Society International Svmposium (APSURSI), Jul. 2014, entire document.

D. J. Gregoire, et. al, "A Design For An Electronically-Steerable Holographic Antenna With Polarization Control," 2015 IEEE International Symposium on Antennas and Propagation & USNC/URSI National Radio Science Meeting, Jul. 2015, entire document.

F.P. Casares-Miranda, et. al, "High-gain active composite right/left-handed leakywave antenna," IEEE Transactions on Antennas and Propagation, Aug. 2006, entire document.

C.-T. M. Wu, et. al, "Ring-Resonator-Inspired Power Recycling Scheme for Gain-Enhanced Distributed Amplifier-Based CRLH-Transmission Line Leaky Wave Antennas," IEEE Transactions on Microwave Theory and Techniques, Apr. 2012, entire document.

* cited by examiner

ELECTRONICALLY-SCANNED ANTENNAS WITH DISTRIBUTED AMPLIFICATION

TECHNICAL FIELD

This presentation relates to antennas such as, for example, electronically scanned antennas.

BACKGROUND

Leaky wave antennas (LWAs) with slotted waveguides have been studied from as early as 1940 (see Ref. [1]), and a precursor to these leaky wave antennas was patented in 1921 (see Refs. [2] and [3]). Generally, an LWA can be a non-resonant antenna, wherein an electromagnetic wave propagates along the antenna and radiates due to the characteristics of a mode supported by the antenna.

LWAs can include uniform antennas, periodic antennas, and quasi-uniform antennas (see Ref. [4]). Uniform antennas can support a fast-wave mode where the phase velocity of the electromagnetic wave propagating along the antenna is greater than the speed of light. With this phase velocity, the antenna radiates as follows:

$$\beta = k_0 \sin \theta, \quad (1)$$

where $\beta$ is the wavenumber of the electromagnetic wave propagating along the antenna, $k_0$ is the wavenumber of the radiated beam in Quasi-uniform antennas, which can operate similarly to uniform antennas, can have subwavelength periodic loadings in order to improve their antenna characteristics.

Periodic LWAs utilize a slow wave guiding structure which has its wavenumber modulated. Under this condition, the antenna can radiate an infinite number of spatial harmonics defined by:

$$\beta = k_0 \sin \theta + n\, k_p \quad (2)$$

where n is an integer which represents the spatial mode number, $k_p$ ($k_p = 2\pi/p$, where p is the modulation period) is the wavenumber of the modulation, $\beta$ is the wavenumber of the electromagnetic wave propagating along the antenna, $k_0$ is the wavenumber of free space, and $\theta$ is the radiation angle with respect to normal of the antenna. The n=−1 mode is generally the most accessible modulation mode and other spatial modes predominantly have minimal or negligible coupling or complex radiation angles when the n=−1 mode is excited.

Traditional leaky wave antennas can have a low aperture efficiency because energy is not radiated equally across the aperture. This is due to radiation leakage and also due to resistive losses along the antenna. Some electronically-scanned antennas particularly can have large losses due to the tuning circuits which allow beam scanning to occur.

There are multiple forms of LWAs which can operate at high frequencies and/or high power. However, these antennas may not have the combined capability for electronic-scanning, distributed amplification for a higher aperture efficiency, and high-frequency operation. These combined capabilities may be desirable for multiple applications.

Artificial impedance surface antennas (AISAs) have been used to create periodic LWAs (see Refs. [6], [7]). These passive antennas have demonstrated high-gain beams and polarization control. AISAs have been studied as holographic antennas where radiation patterns can be obtained by producing an interference between an artificial impedance surface current source and a holographic modulation pattern created on the surface (for example, see Ref. [7].)).

AISAs can be electronically scanned or steered by loading the antenna with tuning circuits such as varactor diodes (see Refs. [8]-[15]). AISAs may be limited in frequency and aperture efficiency by losses in their tuning circuits.

Electronically scanned AISAs have a wide scanning range but their frequency of operation and size are limited by losses in their tuning circuits.

Phased array antennas can be high-gain, electronically-scanned antennas. According to an embodiment of this presentation, antennas presented herein perform equivalently to phased array antennas but have a reduced associated fabrication cost and electronic complexity relative to phased array antennas. This result can be achieved as embodiments of the antennas presented herein do not comprise phase shifters. Phased array antennas require phase shifters for each radiating element. "Phase shifters" as used in the paragraph above relate to known components generally made from switched banks of reactive elements or delay lines. Examples of known phase shifters are for example described in U.S. Pat. No. 7,889,135B2, U.S. Pat. No. 6,366,238B1, EP0613245B1. Embodiments of this presentation, even those having tuning circuits that have the ability to alter the phase of the traveling wave, do not use such known phase shifters.

Composite right/left-Handed (CRLH) antennas utilize capacitive and inductive loadings to allow for improved beam scanning (see Ref. [5]). However, these antennas generally obtain beam scanning by changing the frequency of the electromagnetic wave, and this may not be compatible with multiple applications such as mobile satellite communication. CRLH antennas with distributed amplification have been proposed (see Refs. [16],[17]). However, as with passive CRLH antennas, these antennas cannot scan readily at a single frequency.

Embodiments of this presentation attempt to resolve a number of limitations of the above-described known antennas.

The following references are hereby incorporated herein by reference.

[1] U.S. Pat. No. 2,402,622 issued on Jun. 25, 1946;
[2] U.S. Pat. No. 1,381,089 issued on Jun. 7, 1921;
[3] H. H. Beverage, et al, "The Wave Antenna A New Type of Highly Directive Antenna," Transactions of the American Institute of Electrical Engineers, Vol. XLII, 1923;
[4] D. R. Jackson, et al, "Leaky-Wave Antennas,", Proceedings of the IEEE, July 2012;
[5] C. Caloz, et al., "CRLH metamaterial leaky-wave and resonant antennas," IEEE Antennas and Propagation Magazine, October 2008;
[6] D. Sievenpiper, et al, "Holographic Artificial Impedance Surfaces for Conformal Antennas," 2005 IEEE Antennas and Propagation Society International Symposium, 2005;
[7] B. H. Fong, et. al, "Scalar and Tensor Holographic Artificial Impedance Surfaces," IEEE Transactions on Antennas and Propagation, October 2010;
[8] D. Sievenpiper, et. al, "A steerable leaky-wave antenna using a tunable impedance ground plane," IEEE Antennas and Wireless Propagation Letters, 2002;
[9] J. S. Colburn, et. al, "Adaptive artificial impedance surface conformal antennas," 2009 IEEE Antennas and Propagation Society International Symposium, June 2009;
[10] US 2015/0009070 A1, published Jan. 8, 2015 (now U.S. Pat. No. 9,466,887 B2 issued on Oct. 11, 2016);
[11] US 2015-0009071 A1 published Jan. 8, 2015 (now U.S. Pat. No. 9,455,495 issued on Sep. 27, 2016);

[12] D. J. Gregoire, et al., "Two-dimensionally electronically-steerable artificial impedance surface antenna", U.S. Pat. No. 9,698,479B2 issued on Jul. 4, 2017;

[13] Patel, et al., "Two-dimensionally electronically-steerable artificial impedance surface antenna," U.S. Pat. No. 9,871,293 B2 issued on Jan. 16, 2018;

[14] D. J. Gregoire, et. al, "An electronically-steerable artificial-impedance-surface antenna," 2014 IEEE Antennas and Propagation Society International Symposium (APSURSI), July 2014;

[15] D. J. Gregoire, et. al, "A design for an electronically-steerable holographic antenna with polarization control," 2015 IEEE International Symposium on Antennas and Propagation & USNC/URSI National Radio Science Meeting, July 2015

[16] F. P. Casares-Miranda, et. al, "High-gain active composite right/left-handed leaky-wave antenna," IEEE Transactions on Antennas and Propagation, August 2006;

[17] C.-T. M. Wu, et. al, "Ring-Resonator-Inspired Power Recycling Scheme for Gain-Enhanced Distributed Amplifier-Based CRLH-Transmission Line Leaky Wave Antennas," IEEE Transactions on Microwave Theory and Techniques, April. 2012;

[18] Electrically tunable surface impedance structure with suppressed backward wave U.S. Pat. No. 8,436,785 issued on May 7, 2013;

[19] Adaptive beam forming antenna system using a tunable impedance surface U.S. Pat. No. 7,245,269 B2 issued on Jul. 17, 2007; and

[20] Steerable leaky wave antenna capable of both forward and backward radiation U.S. Pat. No. 7,071,888 B2 issued on Jul. 4, 2006.

SUMMARY

This presentation relates to an electronically scanned antenna. In embodiments of the antenna, sub-wavelength tuning circuits are arranged to tune the phase of a travelling wave, to steer the antenna beam, and amplifiers (not necessarily sub-wavelength) compensate for leaks and resistive losses along the antenna to have a uniform emission. According to some embodiments the amplifiers can be integrated to the tuning circuits, in which case they are arranged at sub-wavelength interval. According to other embodiments the amplifiers can be arranged along an intermediary plane, in which case they can be arranged at a larger interval.

Embodiments of this presentation comprise an electronically scanned antenna with a travelling wave guiding structure having a bottom conductor and a top conductor developing each along a first direction, the top conductor comprising a plurality of first conductive patches arranged periodically along said first direction and connected in series by tuning circuits; the electronically scanned antenna further comprising a plurality of amplifiers arranged for compensating resistive and radiation losses along the length of the travelling wave guiding structure.

According to embodiments of this presentation, each of said plurality of amplifiers is included within each of said tuning circuits.

According to embodiments of this presentation, the antenna is provided for guiding a travelling wave having a predetermined wavelength and the distance between two consecutive first conductive patches along said first direction is sub-wavelength.

According to embodiments of this presentation, each of said tuning circuits is provided to introduce a variable phase delay and a variable gain between the first conductive patches it connects.

According to embodiments of this presentation, each of said tuning circuits comprises a varactor diode arranged to introduce said variable phase delay, and a common emitter amplifier arranged to introduce said variable gain; said varactor diode being connected in series with said common emitter amplifier.

According to embodiments of this presentation, the electronically scanned antenna is arranged such that varying said variable phase delay changes a radiation angle of the antenna; said variable gain being arranged to maintain a 0 dB gain across the entire travelling wave guiding structure.

According to embodiments of this presentation, a dielectric layer supports the top conductor above the bottom conductor.

According to embodiments of this presentation, the electronically scanned antenna further comprises a biasing and control network arranged to operate the amplifier and tuning circuits.

According to embodiments of this presentation, the bottom conductor is connected to a ground and the biasing and control network is arranged below the bottom conductor.

According to embodiments of this presentation, each of the plurality of amplifiers is connected between two consecutive second conductive patches, the second conductive patches being periodically arranged along said first direction on a plane located between the bottom and top conductors.

According to embodiments of this presentation, the antenna is provided for guiding a travelling wave having a predetermined wavelength; the distance between two consecutive first conductive patches along said first direction being sub-wavelength, and the distance between two consecutive second conductive patches along said first direction being larger than the distance between two consecutive first conductive patches along said first direction.

According to embodiments of this presentation, each of said tuning circuits is provided to introduce a variable phase delay between the first conductive patches it connects and each amplifier is provided to introduce a variable gain between the second conductive patches it connects.

According to embodiments of this presentation, each of said tuning circuits comprises a varactor diode arranged to introduce said variable phase delay.

According to embodiments of this presentation, each of said plurality of amplifiers comprises a negative impedance amplifier arranged to introduce said variable gain.

According to embodiments of this presentation, the electronically scanned antenna is arranged such that varying the variable phase delay changes a radiation angle of the antenna, wherein the variable gain is arranged to maintain a 0 dB gain across the entire travelling wave guiding structure.

According to embodiments of this presentation, a first dielectric layer supports the second conductive patches above the bottom conductor and a second dielectric layer supports the top conductor above the second conductive patches.

According to embodiments of this presentation, the electronically scanned antenna further comprises a biasing and control network configured to operate the antenna, tuning circuits, and amplifiers.

According to embodiments of this presentation, the bottom conductor is connected to a ground and the biasing and control network is disposed below the bottom conductor.

According to embodiments of this presentation, the amplifiers comprise each at least one of a negative impedance converter (NIC), a negative impedance inverter (NII), a Gunn diode, a tunnel diode, an IMPact ionization Avalanche Transit-Time (IMPATT) diode, and an operational amplifier.

According to embodiments of this presentation, the antenna comprises two second conductive patches, and said each of the plurality of amplifiers comprises a single amplifier.

The antenna can be an electronically scanned leaky wave antenna, according to an embodiment of this presentation.

The antenna can be a travelling wave antenna, according to an embodiment of this presentation.

Embodiments of this presentation relates to an electronically-scanned, leaky wave antenna with distributed amplification (ELADA).

According to an embodiment of this presentation, a top conductor of the antenna can be loaded with tuning circuits to provide distributed amplification and beam scanning.

According to an embodiment of this presentation, the distance between two consecutive amplifiers can be sub-wavelength. According to an embodiment of this presentation, the amplifiers can be embedded along the antenna.

According to an embodiment of this presentation, the amplifiers can compensate for resistive losses and radiation losses so that the antenna can radiate with a higher aperture efficiency.

According to an embodiment of this presentation, the antenna has the capability for electronic-scanning. According to an embodiment of this presentation, the antenna has distributed amplifiers for a higher aperture efficiency and/or a high-frequency operation.

According to an embodiment of this presentation, the tuning circuits can provide an electronically-tunable phase-shift to an electromagnetic wave propagating along the antenna, which allows for the control of a phase velocity of the electromagnetic wave.

This presentation relates to an electronically-scanned modulated stripline antenna with distributed amplification (EMSADA).

According to an embodiment of this presentation, a top conductor of the antenna can be loaded with the tuning circuits to provide beam scanning. According to an embodiment of this presentation, the tuning circuits can be active circuits.

According to an embodiment of this presentation, the tuning circuits can be reactance tuning circuits.

According to an embodiment of this presentation, first conductive patches can be periodically spaced along the antenna.

According to an embodiment of this presentation, the antenna can further comprise a center conductor, and the center conductor can comprise second conductive patches.

According to an embodiment of this presentation, the center conductor can be loaded with amplifiers to provide distributed amplification. According to an embodiment of this presentation, the amplifiers can be active circuits.

According to an embodiment of this presentation, the amplifiers can be negative resistance amplifiers. According to another embodiment of this presentation, the amplifiers do not comprise a negative resistance amplifier.

According to an embodiment of this presentation, the center conductor can be periodically loaded with the amplifiers, for example, at a spacing of 1-6 wavelengths of the electromagnetic wave.

According to an embodiment of this presentation, beam scanning can be performed by periodically modulating the reactance of the top conductor.

According to an embodiment of this presentation, by including amplifiers in the antenna, the antenna can be designed to radiate equally across the aperture despite, for example, losses in the tuning circuits or losses due to radiation.

According to an embodiment of this presentation, the amplifiers can be used for aperture tapering.

According to an embodiment of this presentation, the antenna can allow a higher frequency operation, a higher aperture efficiency, and/or a higher power handling. By separating the amplifiers from the tuning circuits, the amplifiers can be arranged more sparsely along an antenna, according to an embodiment of this presentation, thus, for example, improving stability, reducing cost, and reducing the challenge of component-integration at high frequencies and small wavelengths.

According to an embodiment of this presentation, the tuning circuits can be amplifying tuning circuits that have an electronically-tunable phase delay.

According to an embodiment of this presentation, the amplifying tuning circuits can have a variable amplification.

According to an embodiment of this presentation, the amplifiers can comprise a hybrid amplifier. According to an embodiment of this presentation, the hybrid amplifiers can be constructed from commercial off-the-shelf (COTS) components.

According to an embodiment of this presentation, the tuning circuits can comprise a monolithic microwave integrated circuit.

According to an embodiment of this presentation, the tuning circuits can be phase-tuning circuits.

According to an embodiment of this presentation, the tuning circuits can comprise a varactor diode.

According to an embodiment of this presentation, the phase-tuning circuits can comprise an electronically tunable component.

According to an embodiment of this presentation, the antenna can radiate by exciting a fast-wave mode that is generated by the phase shift of the tuning circuits.

According to an embodiment of this presentation, the antenna can radiate due to a periodic modulation of the phase shift along the antenna which excites Floquet modes.

According to an embodiment of this presentation, the amplifiers can comprise a negative impedance converter.

According to an embodiment of this presentation, the negative impedance converter can have tunable resistance.

According to an embodiment of this presentation, the amplifiers can comprise a negative impedance inverter.

According to an embodiment of this presentation, the negative impedance inverter can have tunable resistance.

According to an embodiment of this presentation, the amplifiers can comprise a Gunn diode.

According to an embodiment of this presentation, the amplifiers can comprise a tunnel diode.

According to an embodiment of this presentation, the amplifiers can comprise an Impact ionization Avalanche Transit-Time Diode (IMPATT) diode.

According to an embodiment of this presentation, the amplifiers can comprise an operational amplifier.

According to an embodiment of this presentation, the amplifiers can comprise a monolithic microwave integrated circuit.

According to an embodiment of this presentation, the tuning circuits can be modulating circuits.

According to an embodiment of this presentation, the tuning circuits can comprise each a varactor diode.

According to an embodiment of this presentation, each tuning circuit can comprise a PIN diode; and for example be arranged for controlling a bias current through the PIN diode to control its impedance.

According to an embodiment of this presentation, each tuning circuit can comprise a Schottky diode, and for example be arranged for controlling a bias voltage of the Schottky diode to control its impedance.

According to an embodiment of this presentation, the tuning circuits can comprise each an electronically tunable component.

According to an embodiment of this presentation, the antenna is not a passive antenna.

According to an embodiment of this presentation, the amplifiers can be distributed along the antenna. The amplifiers can compensate for the losses in the tuning circuits to improve an aperture efficiency of the antenna.

According to an embodiment of this presentation, the antenna can scan at a single predetermined frequency.

According to an embodiment of this presentation, the antenna can utilize a microstrip topology with subwavelength loading of tuning circuits.

These and other features and advantages will become further apparent from the detailed description and accompanying figures that follow. In the figures and description, numerals indicate the various features, like numerals referring to like features throughout both the drawings and the description.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the claimed invention.

ELADA Embodiments

An antenna according to embodiments of this presentation can be an Electronically-scanned Leaky-wave Antenna with Distributed Amplification (ELADA). According to an embodiment of this presentation, the radiation pattern of the antenna can be scanned at a single frequency using tuning circuits which can have a voltage-controlled phase delay. According to an embodiment of this presentation, the tuning circuits can be referred to as phase-tuning circuits because, for example, they can provide a voltage-controlled phase delay to the antenna. The tuning circuits can provide gain to compensate for losses in the tuning circuits themselves as well as losses due to radiation. According to an embodiment of this presentation, the antenna can radiate with a desired radiation pattern. According to an embodiment of this presentation, the tuning circuits can alter the radiation pattern and provide gain to compensate for losses along the length of the antenna. A sweeping alteration of the radiation pattern, for example changing the angle of radiation of the antenna (e.g., from a negative angle to a positive angle) with respect to normal, is hereby called a scan of the radiation pattern.

According to an embodiment of this presentation, the antenna can comprise a biasing and control network which can provide power to the antenna. According to an embodiment of this presentation, the biasing and control network can provide the appropriate voltages to operate the antenna and the tuning circuits.

Figure 1:
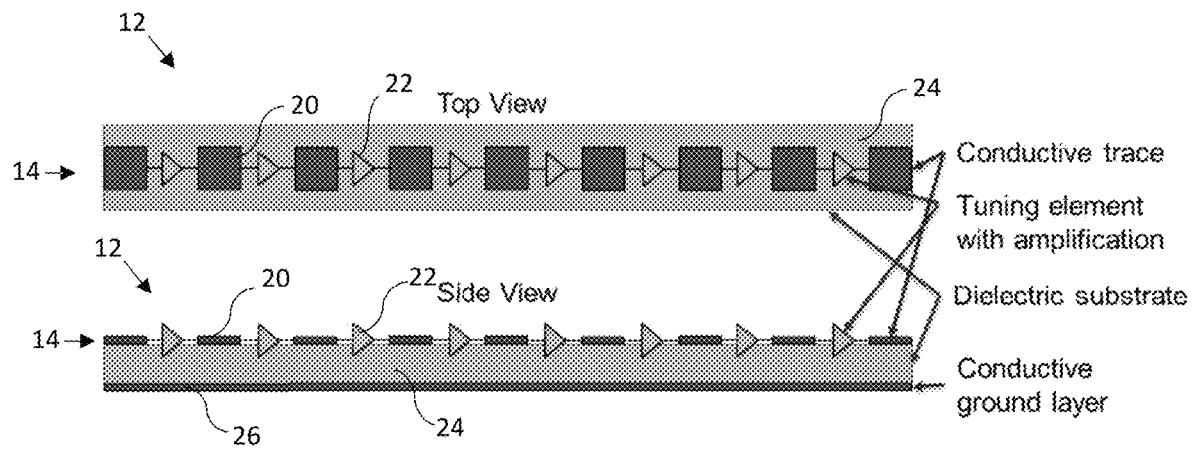
FIG. 1 shows a top view and a side view of an antenna, according to an embodiment of this presentation.

FIG. 1 shows a top view and a side view of an antenna 12, according to an embodiment of this presentation, comprising a travelling wave guiding structure having a top conductor 14 and a bottom conductor 26. According to an embodiment of this presentation, the top 14 and bottom 26 conductors can be arranged along first and second layers of the antenna 12, respectively. According to an embodiment of this presentation, and as shown, the antenna can comprise a dielectric layer 24 that supports the top conductor 14 above the bottom conductor 26. According to an embodiment of this presentation, the dielectric layer 24 can be a dielectric substrate 24.

According to an embodiment of this presentation, and as shown, the bottom conductor 26 can develop along a first direction. According to an embodiment of this presentation, the bottom conductor 26 can be connected to a ground (not shown), to form, for example, a ground plane 26. This ground plane 26 can be advantageous because it can allow the antenna 12 to be placed on the exterior of conducting surfaces (now shown), and/or allow a biasing and control network (e.g., shown in FIG. 2 and detailed hereafter) to be placed behind the antenna 12, for example, behind the ground plane 26.

According to an embodiment of this presentation, and as shown, the top conductor 14 can develop along the first direction. According to an embodiment of this presentation, the top conductor 14 can comprise a plurality of first conductive patches 20. According to an embodiment of this presentation, the first conductive patches 20 can be arranged periodically along the first direction. According to an embodiment of this presentation, and as shown, the first conductive patches 20 can be connected in series by tuning circuits 22.

If the tuning circuits 22 were replaced with a conductor, the antenna 12 would be a two-conductor transmission line. According to an embodiment of this presentation, antenna 12 can be modeled as an effective medium, as an active metamaterial or metasurface, and/or the antenna 12 can be modeled using transmission line methods.

According to embodiments of this presentation, the tuning circuits 22 can be placed at a sub-wavelength spacing along said first direction. Accordingly, the distance between two consecutive first conductive patches 20 along the first direction can be sub-wavelength. According to an embodiment of this presentation, the antenna 12 can be considered to be an array of unit cells periodically arranged along the antenna 12, where each unit cell comprises, for example, a conductive patch 20, a tuning circuit 22, as well as portions of the dielectric layer 24 and the bottom conductor 24 associated with the conductive patch 20 and the tuning circuit 22.

Figure 2:
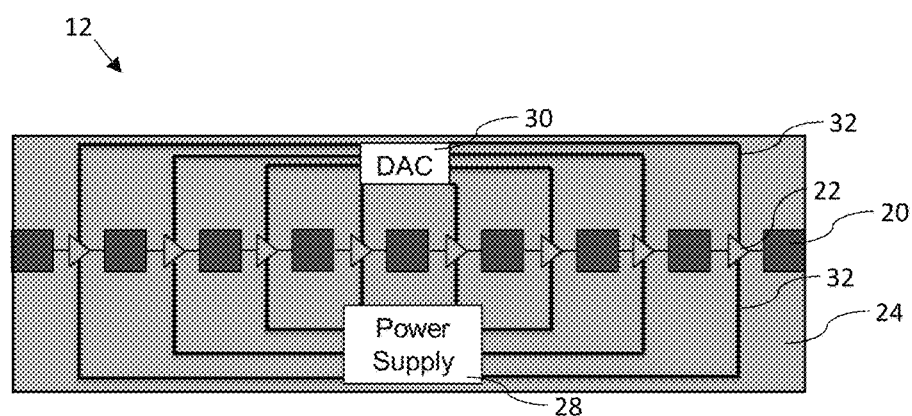
FIG. 2 shows a top view of the antenna shown in FIG. 1, according to an embodiment of this presentation, further comprising a biasing and control network.

FIG. 2 shows a top view of the antenna 12, according to an embodiment of this presentation, further comprising a biasing and control network, comprising a power supply 28, and a digital-to-analog converter (DAC) 30. According to an embodiment of this presentation, and as shown, the power supply 28 and the DAC 30 can be electrically connected to the tuning circuits 22 via electrical connections 32. The biasing and control network can be used to scan the radiation pattern of the antenna 12, according to an embodiment of this presentation. For example, the DAC 30 can apply a voltage to a tuning circuit 22, which can allow a phase delay across the tuning circuit 22 to be modified, according to an embodiment of this presentation. According to an embodiment of this presentation, the DAC 30 can apply a respective voltage to each tuning circuit 22, which can allow the phase delay across each tuning circuit 22 to be modified, thus controlling the beam direction. According to an embodiment of this presentation, the DAC 30 can apply the same voltage to each tuning circuit 22. According to an embodiment of this presentation, the power supply 28 can provide a respective voltage source to each amplifier (e.g., shown in FIG. 3) in tuning circuits 22. According to an embodiment of this presentation, the power supply 28 can provide the same voltage source to each amplifier.

In FIG. 2 the power supply 28 and DAC 30 are shown on a top side of the antenna, but they can alternatively be placed behind the antenna 12 and/or on a separate circuit board (not shown), according to embodiments of this presentation. The DAC 30 can be interfaced with a field-programmable gate array (FPGA) (not shown) or a computer (not shown) in order to control the beam direction, according to an embodiment of this presentation.

According to an embodiment of this presentation, the antenna 12 can be operated as a quasi-uniform or as a periodic LWA depending on the biasing of the tuning circuits 22. If the antenna 12 is operated as a quasi-uniform antenna 12, the tuning circuits 22 can be biased to have a sufficiently positive phase shift (using engineering phasor convention) so that the guided electromagnetic wave has a faster-than-light phase velocity. This can cause the antenna 12 to radiate as described in Eq. 1, and the radiation angle can be scanned by tuning the phase delay provided by the tuning circuits 22. Additionally, or alternatively, the antenna 12 can be operated as a periodic LWA by modulating the phase over some modulation period, p, as described in Eq. 2. In this operation, the phase can be modulated over a range of negative shifts so that the average phase velocity is slower than light. In this operating mode, the radiation pattern can be scanned by tuning the modulation period p. In both operations, and as detailed hereafter, the amplification of the tuning circuits 22 can compensate for losses along the length of the antenna.

According to an embodiment of this presentation, each of the tuning circuits 22 shown in FIGS. 1 and 2 can provide a variable phase delay between the first conductive patches it connects, to for example allow beam pattern scanning. According to an embodiment of this presentation, the tuning circuits 22 can have a tunable reactance such as, for example, a voltage-controlled reactance, where a change of the reactance allows changing the phase of the traveling wave. During operation, the radiation angle of the antenna 12 according to an embodiment of this presentation can be determined by the tunable reactance or the tunable capacitance of the tuning circuits 22. According to an embodiment of this presentation and as detailed hereafter for example in relation with FIG. 3, the tunable reactance of the tuning circuits 22 can be a tunable capacitance such as, for example, a voltage-controlled capacitance. In such a case the radiation angle of the antenna 12 can therefore be changed by changing the reactance or the capacitance of the tuning circuits 22.

Figure 3:
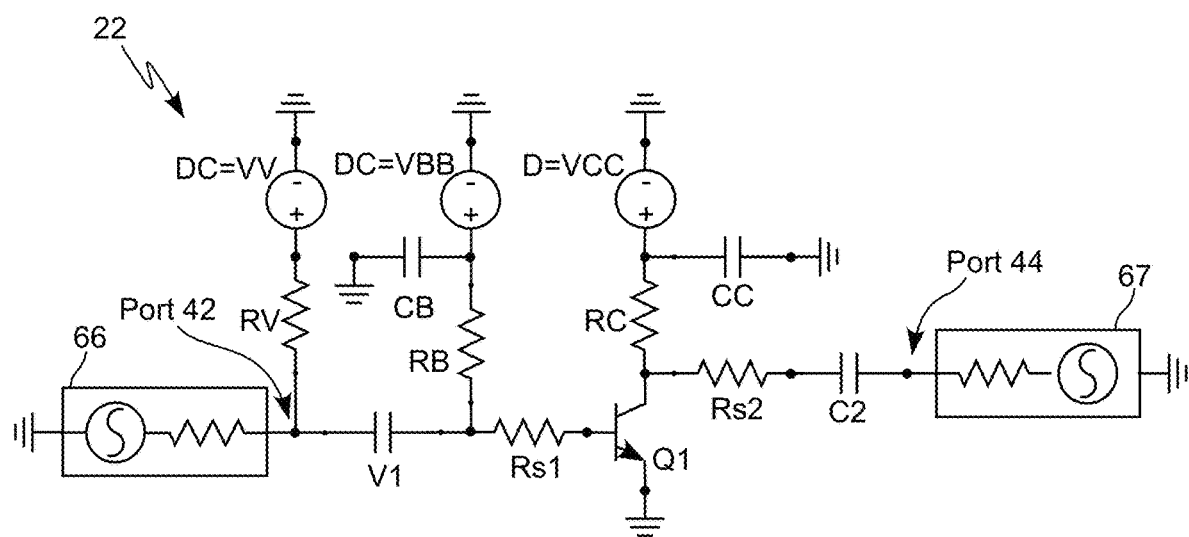
FIG. 3 shows a circuit diagram of a tuning circuit, according to an embodiment of this presentation.

According to an embodiment of this presentation and as detailed hereafter for example in relation with FIG. 3, each of the tuning circuits 22 can provide a variable gain between the first conductive patches it connects, to for example give control of the field magnitude along the aperture of the antenna 12. According to an embodiment of this presentation, and as detailed hereafter, the tuning circuits 22 can comprise variable gain amplifiers to provide the variable gain.

Any circuit which can provide any of the above features can suitably be used as a tuning circuit 22.

FIG. 3 shows a circuit diagram of a tuning circuit 22, according to an embodiment of this presentation. According to an embodiment of this presentation, and as shown, the tuning circuit 22 can comprise a varactor diode V1 arranged to, for example, introduce the variable phase delay. According to an embodiment of this presentation, and as shown, the tuning circuit 22 can comprise an amplifier Q15 arranged to, for example, provide the variable gain. According to an embodiment, the varactor diode V1 can be connected in series with the amplifier Q1. According to an embodiment of this presentation, the amplifier Q1 can be a transistor amplifier, such as for example, a common emitter amplifier. According to an embodiment of this presentation, a first terminal of the varactor diode V1 can be connected to a first port 42 of the tuning circuit 22. The first circuit 66 connected to the first port 42 and the second circuit 67 connected to the second port 44 (detailed hereafter) were simulation circuits used to perform simulations on the tuning circuit 22, and do not form part of embodiments of this presentation.

According to an embodiment of this presentation, and as shown, the tuning circuit 22 can comprise a first resistor RV, a second resistor RB, a third resistor Rs1, a fourth resistor Rs2, and/or a fifth resistor RC. According to an embodiment of this presentation, third resistor Rs1 and fourth resistor Rs2 can have the same resistance. According to an embodiment of this presentation, and as shown, the tuning circuit 22 can comprise a first capacitor CB, a second capacitor CC, and/or a third capacitor C2. According to an embodiment of this presentation, the first terminal of the varactor diode V1 can be connected to a voltage bias VV through the first resistor RV during operation. According to an embodiment of this presentation, and as shown, a second terminal of the varactor diode V1 can be connected to a voltage bias VBB though the second resistor RB during operation. According to an embodiment of this presentation, the second terminal of the varactor diode V1 can be connected to the amplifier Q1. If the amplifier Q1 is a bipolar junction transistor, the second terminal of the varactor diode V1 can be connected to a base terminal of the bipolar junction transistor though the third resistor Rs1. According to an embodiment of this presentation, the second terminal of the varactor diode V1 can be connected to ground through a first series circuit comprising the second resistor RB connected in series with the first capacitor CB.

According to an embodiment of this presentation, if the amplifier Q1 is a bipolar junction transistor, a collector terminal of the bipolar junction transistor can be connected to a voltage bias VCC through the fifth resistor RC during operation. According to an embodiment of this presentation, the collector terminal of the bipolar junction transistor can be connected to ground through a second series circuit comprising the fifth resistor RC connected in series with the second capacitor CC. According to an embodiment of this presentation, if the amplifier Q1 is a bipolar junction transistor, an emitter terminal of the bipolar junction transistor can be connected to ground.

According to an embodiment of this presentation, the collector terminal of the bipolar junction transistor can be connected to a second port 44 through a third series circuit comprising the fourth resistor Rs2 connected in series with the third capacitor C2. According to an embodiment of this presentation, the first port 42 of the tuning circuit 22 can be connected to one conductive patch 20, and the second port 44 can be connected to another conductive patch 20, wherein the conductive patches 20 are consecutive conductive patches.

The varactor diode V1 has a tunable capacitance which is, in the illustrated embodiment, controlled by the voltage (e.g., DC voltage) between its first and second terminals. Tuning the capacitance of the varactor diodes V1 can be used to create the voltage-controlled phase delay of the antenna 12. In operation, there can be a negligible voltage drop across the first and second resistors RV and RB so that the voltages at the first and second terminals of the varactor diode V1 are approximately the voltages VV and VBB, respectively. The first resistor RV can be placed on the VV bias line so that it acts as a RF choke. According to an embodiment of this presentation, if the amplifier Q1 is a common emitter amplifier, the amplifier can be a (e.g., single) bipolar junction transistor with its emitter terminal grounded. According to an embodiment of this presentation, different voltage biases VBB and VCC can be respectively applied to the base and collector terminals of the bipolar junction transistor. The third capacitor C2 can be used as a DC blocking capacitor that can isolate the collector terminal of the bipolar junction transistor from the voltage VV of the adjacent tuning circuit 22 when the amplifiers Q1 are arranged in an array in the antenna.

The gain of the amplifier Q1 can be controlled by controlling the voltage VBB, according to an embodiment of this presentation. The first and second capacitors CB and CC can short circuit the RF path to ground, and the resistors Rs1, Rs2, RB, and RC can be used for input and output impedance matching and to reduce gain, according to an embodiment of this presentation. Reducing the gain of the tuning circuit 22 can make the tuning circuit 22 stable, according to an embodiment of this presentation. Because the antenna 12 can have many amplifiers Q1 connected in series, an abundance of gain can be provided so that it is not necessary to maximize the gain in each tuning circuit 22.

The amplifier Q1 can be created by using a monolithic microwave integrated circuit (MMIC), or by using a hybrid architecture where each component is a commercial off-the-shelf (COTS) device connected by a printed circuit board (PCB), according to embodiments of this presentation. Amplifiers Q1 created by using MMICs can have better performance than those created by using hybrid architectures, while amplifiers Q1 created by using hybrid architectures are cheaper and are able to be fabricated with shorter lead times. Therefore, using a hybrid architecture can allow a rapid prototyping of the antenna. However, hybrid architectures can have: a larger device area due to having discrete components; and significantly lower operating frequencies due to large parasitic inductances and capacitances caused by the traces on the PCB. In order to operate at higher frequencies, MMICs can be used instead.

Figure 4:
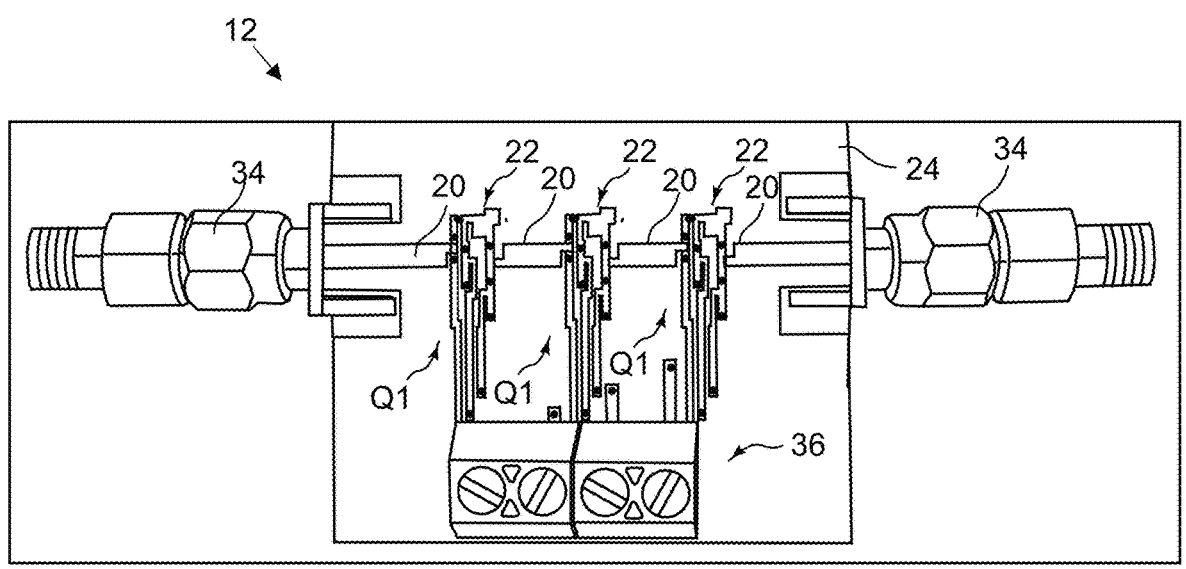
FIG. 4 shows a prototype of the antenna shown in FIG. 1, according to an embodiment of this presentation.

FIG. 4 shows a prototype of the antenna 12 comprising a plurality of conductive patches 20 connected in series by tuning circuits 22, according to an embodiment of this presentation. While three tuning circuits 22 are shown in FIG. 4, it should be understood that two or more tuning circuits 22 can be utilized, according to an embodiment of this presentation. As shown, the three tuning circuits 22 can comprise three respective amplifiers Q1 connected in series by conductive patches 20 with end launch SubMiniature version A (SMA) adapters 34 placed at both ends of a PCB 24, according to an embodiment of this presentation. The antenna shown in FIG. 4 comprises three unit cells, wherein each unit cell comprises a tuning circuit 22 connected in series with a conductive patch 20, according to an embodiment of this presentation. As shown, a header 36 can be attached at the bottom of the PCB 24 to connect to the four voltages needed to operate the board: VV, VBB, VCC, and ground. In the embodiment of FIG. 4, each tuning circuit 22 can receive the same voltage VV and the same voltage VBB, but this embodiment can also be implemented as depicted in FIG. 2 such that each tuning circuit 22 receives a different voltage VV and a different voltage VBB. Accordingly, each varactor diode V1 of the tuning circuits 22 can have a respective capacitance $C_{varactor}$, according to an embodiment of this presentation. In other embodiments, each varactor diode V1 of the tuning circuits 22 can have the same capacitance $C_{varactor}$.

A variation of the prototype of the antenna 12 was simulated using a full-wave solver in order to determine the parasitics due to the layout of its circuitry. This variation of the antenna 12 was most sensitive to the parasitic inductance on the emitter ground of the tuning circuits, and this parasitic inductance is what limited the operation frequency of the antenna.

Figure 5:
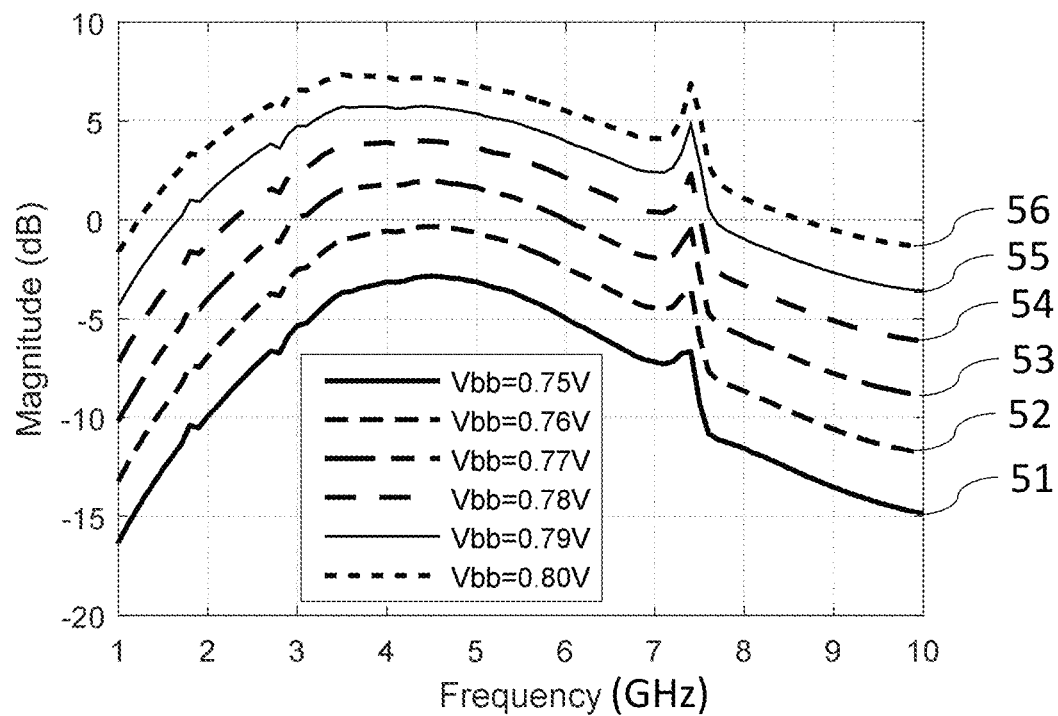
FIG. 5 graphically shows a simulation of a magnitude of a scattering parameter S21 (i.e., the gain) as a function of operation frequency for a variation of the antenna shown in FIG. 4, according to an embodiment of this presentation.

FIG. 5 graphically shows a simulation of a magnitude of a scattering parameter S21 (i.e., the gain) as a function of operation frequency for a variation of the antenna 12, comprising a single tuning circuit (e.g., tuning circuit 22 shown in FIG. 3) and a single amplifier (e.g., amplifier Q1 shown in FIG. 3), according to an embodiment of this presentation. FIG. 5 shows a sweep of the voltage Vbb (which refers to the voltage VBB of the tuning circuit 22 shown in FIG. 3) where for each curve, the varactor diode has a fixed capacitance $C_{varactor}$=0.7 pF. Sweeping the voltage VV (e.g., the voltage VV in FIG. 3) while sweeping the voltage Vbb can be performed to ensure that the varactor diode has a fixed capacitance $C_{varactor}$. The capacitance $C_{varactor}$ is the capacitance of the varactor diode V1 (e.g., shown in FIG. 3) in the tuning circuit 22. Curves 51-56 respectively correspond to voltages Vbb=0.75V, 0.76V, 0.77V, 0.78V, 0.79V, and 0.80V. FIG. 5 shows that the gain of the amplifier Q1 can be varied by modifying the voltage Vbb. In particular, FIG. 5 shows that increasing the voltage Vbb can increase the gain of the amplifier Q1 for operation frequencies at approximately 10 GHz and lower, according to an embodiment of this presentation. A variable gain can be used to compensate for changes in the leakage rate of the antenna as a function of the scan angle, and for changes in the scattering parameters of the amplifier Q1 due to the capacitance $C_{varactor}$, according to an embodiment of this presentation. The compensation can ensure that the amplifier Q1 provides a uniform field magnitude across the antenna and therefore, an optimal aperture efficiency. While a single tuning circuit 22 is simulated in FIG. 5, the description here can apply to any tuning circuit 22 and/or amplifier Q1 of an antenna if the antenna comprises more than one tuning circuit 22, according to an embodiment of this presentation.

Figure 6:
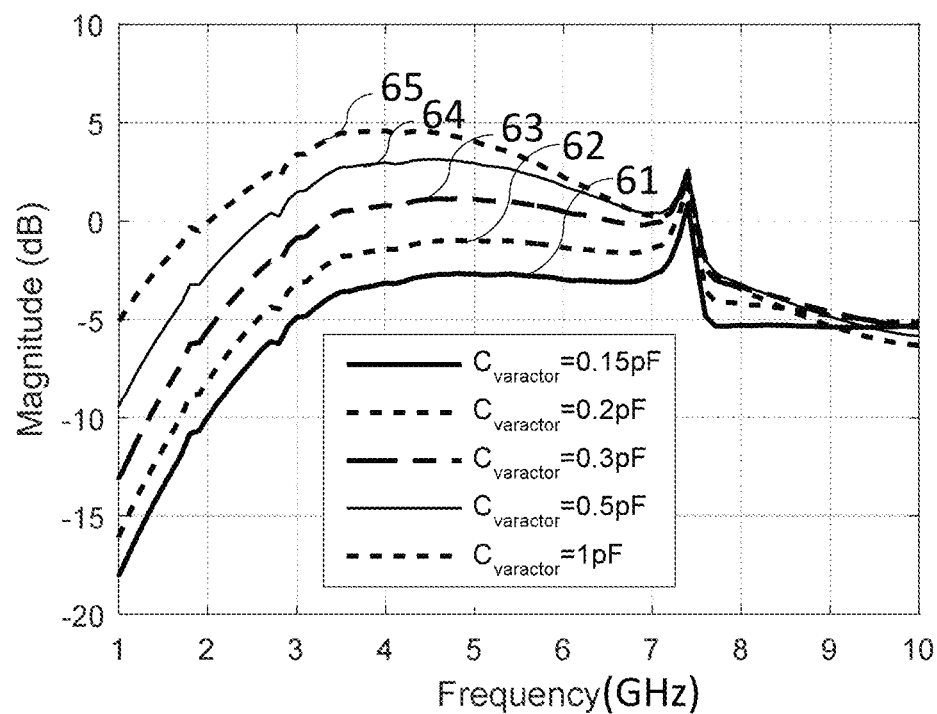
FIG. 6 graphically shows another simulation of the magnitude of the scattering parameter S21 as a function of operation frequency for the same antenna simulated in FIG. 5, according to an embodiment of this presentation.

FIG. 6 graphically shows another simulation of the magnitude of the scattering parameter S21 as a function of operation frequency for the same antenna as simulated in FIG. 5. FIG. 6 shows a sweep of the capacitance $C_{varactor}$ where for each curve, the tuning circuit 22 has a fixed voltage Vbb=0.78V. Sweeping the voltage VV while fixing the voltage Vbb can be performed to sweep the capacitance $C_{varactor}$. Curves 61-65 respectively correspond to varactor diode V1 capacitances $C_{varactor}$=0.15 pF, 0.2 pF, 0.3 pF, 0.5 pF, and 1 pF. FIG. 6 shows that the gain of the amplifier Q1 can be varied by modifying the capacitance $C_{varactor}$. In particular, FIG. 6 shows that increasing the capacitance $C_{varactor}$ can increase the gain of the amplifier for operation frequencies at approximately 7 GHz and lower.

Figure 7:
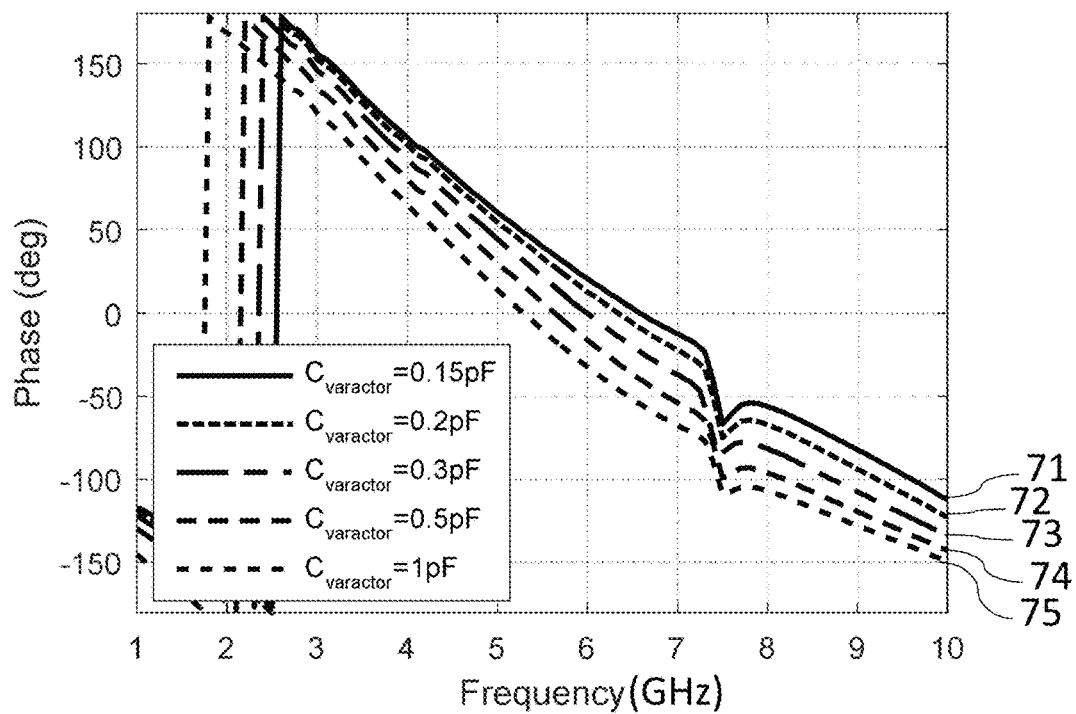
FIG. 7 shows a simulation of the phase delay as a function of operation frequency for the same antenna simulated in FIG. 5, according to an embodiment of this presentation.

FIG. 7 graphically shows a simulation of the phase delay as a function of operation frequency for the same antenna as simulated in FIG. 5. FIG. 7 relates to FIG. 6 in that it also shows a sweep of the varactor diode V1 capacitance $C_{varactor}$ where for each curve, the tuning circuit 22 has a fixed voltage Vbb=0.78V. Curves 71-75 respectively correspond to capacitances $C_{varactor}$=0.15 pF, 0.2 pF, 0.3 pF, 0.5 pF, and 1 pF. FIG. 7 shows that for a capacitance $C_{varactor}$ tuning between 0.15 pF to 1 pF, the phase delay of the amplifier Q1 output can vary by 35 degrees at 3 GHz, and by 55 degrees at 7 GHz. The sign of the phase shift of the amplifier Q1 can vary with the operation frequency. For positive phase shifts, the amplifier Q1 can increase the phase velocity of the guided electromagnetic wave and the antenna is preferably operated as a fast-wave, quasi-uniform LWA, according to an embodiment of this presentation. According to an embodiment of this presentation, for negative phase shifts the amplifier Q1 can decrease the phase velocity of the guided electromagnetic wave and the antenna is preferably operated as a periodic LWA. Along with the effect on phase delay, the varactor diode V1 capacitance $C_{varactor}$ can have an impact on the magnitude of the gain (scattering parameter S21), as shown in FIG. 6. This effect can be compensated for by tuning the voltage VBB, as shown in FIG. 5. According to embodiments of this presentation, the amplifier tuning is so small that it would negligibly impact the desired value for VV.

Figure 8:
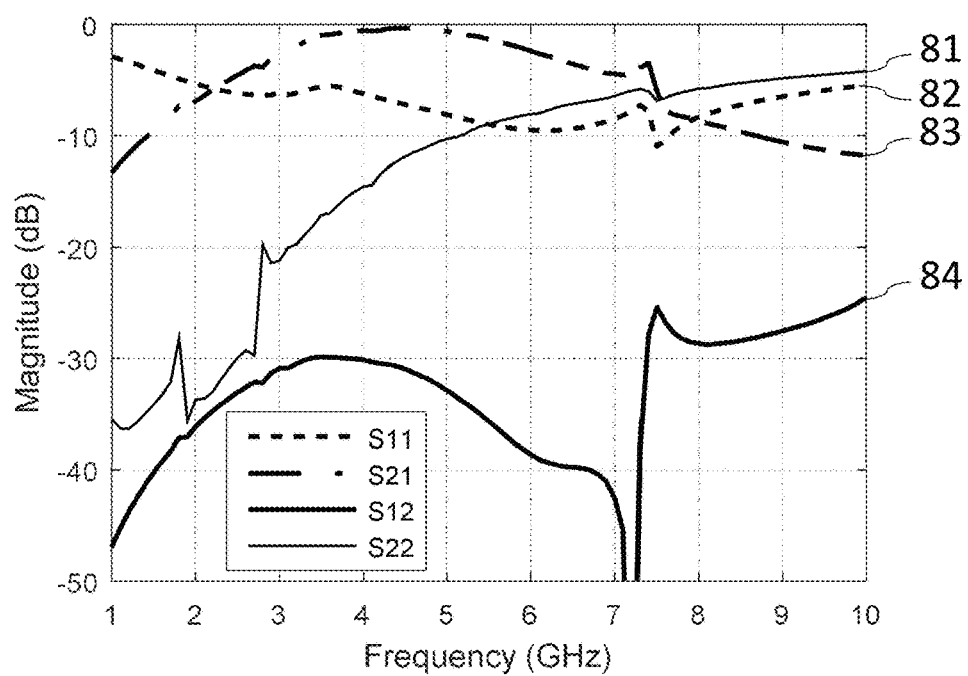
FIG. 8 graphically shows a simulation of the magnitude of the scattering parameters S11, S21, S12, and S22 as a function of operation frequency for the same antenna simulated in FIG. 5, according to an embodiment of this presentation.
Figure 9:
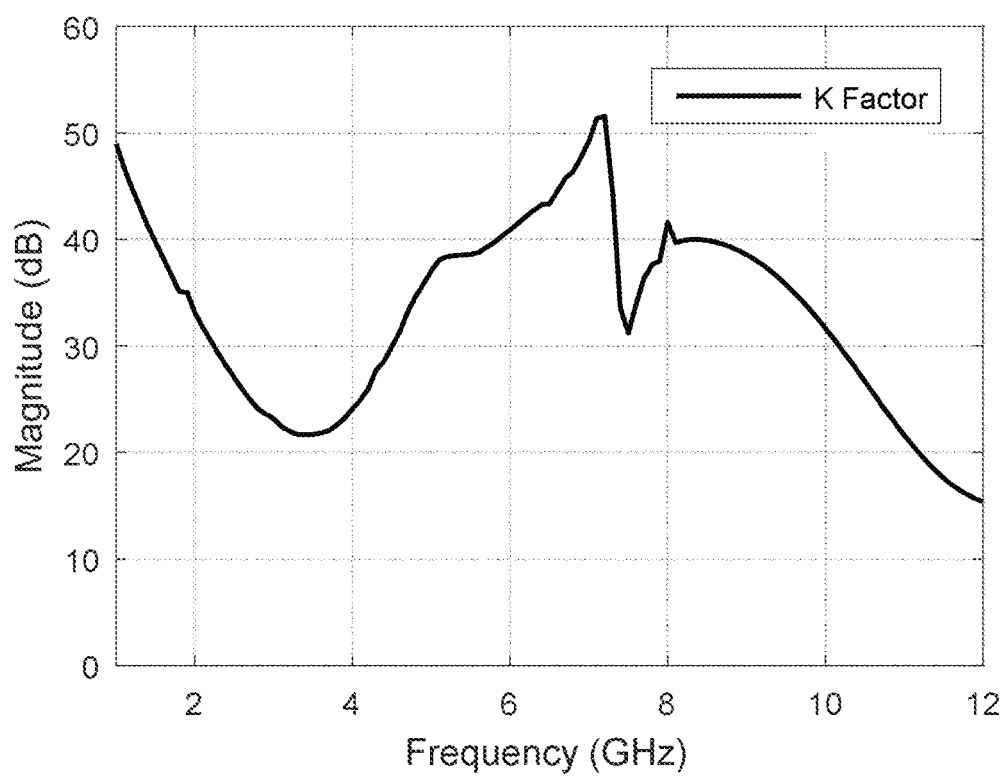
FIG. 9 graphically shows the K factor stability corresponding to FIG. 8, according to an embodiment of this presentation.

FIG. 8 graphically shows the magnitude of the scattering parameters S11, S21, S12, and S22 as a function of operation frequency for the same antenna simulated in FIG. 5, according to an embodiment of this presentation, wherein the tuning circuit 22 has a fixed voltage Vbb=0.78V and wherein the varactor diode V1 has a fixed capacitance $C_{varactor}$=0.7 pF. FIG. 9 graphically shows the corresponding K factor stability, according to an embodiment of this presentation, which can be defined by the equation below.

$$K = \frac{1 - |S_{11}|^2 - |S_{22}|^2 + |\Delta|^2}{2|S_{21}S_{12}|}$$
$$\Delta = S_{11}S_{22} - S_{12}S_{21}$$

where K is the K factor stability, and Sn, S22, S21, and S12 are respectively the same as the scattering parameters S11, S21, S12, and S22.

The biasing condition (of Vbb=0.78V and $C_{varactor}$=0.7 pF) is representative of a "normal" operating condition because the magnitude of S21 is near 0 dB over the operation frequency band from 3.5-5 GHz, as can be seen in FIG. 8. A two-port network is unconditionally stable for K>1 (in logarithmic units, K>0 dB). The K-factor is plotted versus the frequency of the antenna, and as can be seen, the tuning circuit 22 is unconditionally stable by a wide frequency range of more than 15 dB across the entire frequency band. According to embodiments of this presentation, the amplifier/tuning circuit 22 needs to be stable. According to embodiments of this presentation, in practice at some frequency the amplifier will have a gain less than 1 and it will be stable. In the illustrated case, the amplifier has a gain<1 above 8 GHz, so the plot goes up to 12 GHz only just to show some margin.

In some embodiments of this presentation, the antenna can comprise multiple tuning circuits 22 connected in series, effectively being a multi-stage amplifier, and K-factor stability tests cannot be directly applied to these embodiments. The antenna, as illustrated in FIG. 1, can be designed to reduce or minimize inter-stage feedback from the output of each amplifier Q1 to any tuning circuit 22 in a previous stage connected to the amplifier Q1, according to an embodiment of this presentation. According to an embodiment of this presentation, the tuning circuits 22 can be configured to prevent an an electromagnetic wave travelling in a forward direction from creating feedback to amplifiers Q1 connected in previous stages (e.g., amplifiers Q1 that the electromagnetic wave has travelled through).

The antenna 12 shown in FIGS. 1 and 2 can be any length, but LWAs are traditionally electrically long in order to take advantage of their travelling wave nature and to obtain a high gain. Increasing the length of the antenna 12 can increase the number of conductive patches 20 and tuning circuits 22 that are connected in series, thereby increasing the number of amplifiers in the antenna 12. Increasing the number of amplifiers can increase the gain of the antenna 12.

Figure 10:
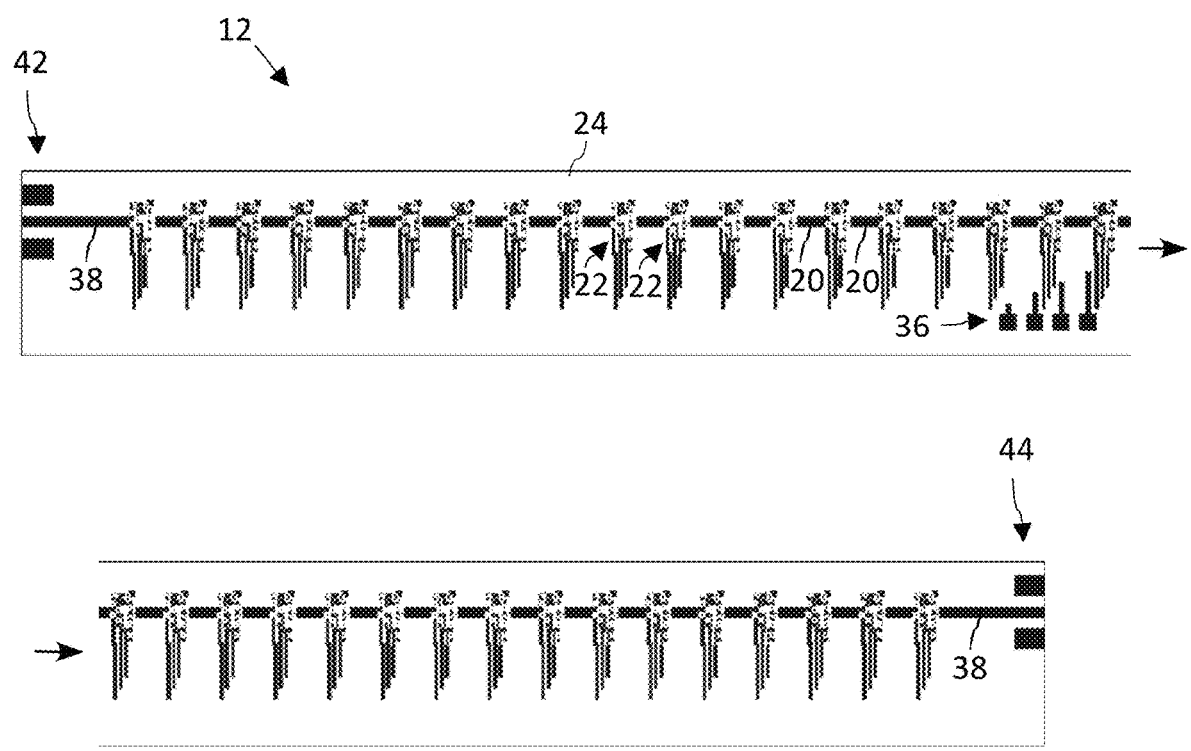
FIG. 10 shows a fast-wave, quasi-uniform antenna, according to an embodiment of this presentation.

FIG. 10 shows a fast-wave, quasi-uniform antenna 12, according to an embodiment of this presentation, comprising 35 unit cells, each comprising a tuning circuit 22 and a conductive patch 20. The antenna is excited from a first 50Ω microstrip 38 and is terminated on the far end at a second 50Ω microstrip 38. The unit cell dimension (i.e. spacing between consecutive tuning circuits 22) can be 10 mm and as shown, the antenna 12 can comprise a 20 mil Rogers 5880 substrate 24 on which the conductive patches 20 and the tuning circuits 22 are disposed. As shown, a header 36 can be attached at the bottom of the substrate 24 to provide electrical connections to the tuning circuits 22. In FIG. 10, port 1 is located on the left and port 2 is located on the right. The tuning circuits 22 can be unilateral and provide gain in the forward direction (left-to-right) and can absorb in the reverse direction (right-to-left). Therefore, the antenna can be non-reciprocal and electromagnetic waves can only travel left-to-right along the antenna, according to an embodiment of this presentation. One result of this non-reciprocity is that port 1 can be exclusively a transmit port, and port 2 can be a receive port. According to the embodiment shown in FIG. 10, the voltages VBB of the tuning circuits 22 are the same, and the voltages VV of the tuning circuits are the same. However, in other embodiments, the voltages VBB can be different voltages, and the voltages VV can be different voltages. The voltages VV can be tuned to tune the capacitance $C_{varactor}$ of the varactor diodes (e.g., varactor diode V1 in FIG. 3) of the tuning circuits 22, wherein a change in the capacitance allows tuning the phase of the traveling wave to either make the phase velocity faster or slower. According to an embodiment of this presentation, the capacitance $C_{varactor}$ of the varactor diodes can be tuned to give a range of faster-than-light phase velocities. The voltages VBB can be set to give a gain of 0 dB across the entire antenna 12 so that the antenna 12 radiates uniformly across the entire aperture, and this condition can give a peak aperture efficiency, according to an embodiment of this presentation.

Figure 11:
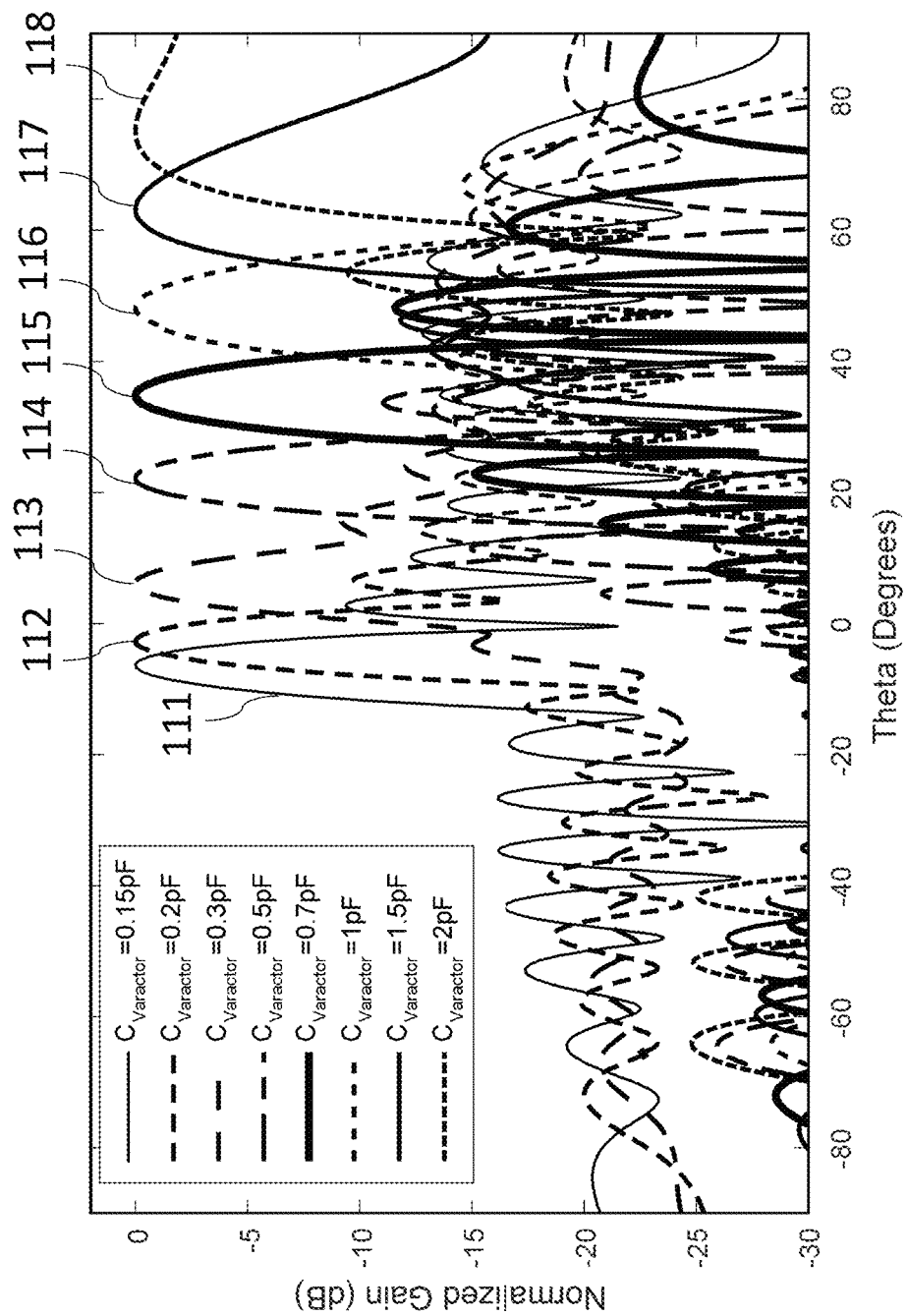
FIG. 11 graphically shows a simulation of the normalized gain as a function of the scan angle for an antenna comprising 48 unit cells operating at 5 GHz, according to an embodiment of this presentation.

FIG. 11 graphically shows a simulation of the normalized gain as a function of the scan angle for an antenna comprising 48 unit cells operating at 5 GHz, according to an embodiment of this presentation, each unit cell comprising a conductive patch (e.g., conductive patch 20 shown in FIG. 1) and a tuning circuit (e.g., tuning circuit 22 shown in FIGS. 1 and 3). The capacitance $C_{varactor}$ of each varactor diode (e.g., varactor diode V1 shown in FIG. 3) was swept in order to scan the radiated beam. Curves 111-118 respectively correspond to varactor diode V1 capacitances $C_{varactor}$=0.15 pF, 0.2 pF, 0.3 pF, 0.5 pF, 0.7 pF, 1 pF, 1.5 pF, and 2 pF. As shown, the beam scans from approximately −7 degrees to approximately 75 degrees as the capacitance $C_{varactor}$ is tuned from 0.15 pF to 2 pF. The width of the radiated beam is smallest near broadside (i.e., at 0 degrees) because the antenna has the largest effective area at this angle. Below the capacitance $C_{varactor}$=0.15 pF, the varactor diode V1 in each tuning circuit 22 becomes too close to an open-circuit and can disrupt the operation of the amplifier (e.g., amplifier Q1 shown in FIG. 3). An increased scan angle range can be achieved in multiple ways including: 1) decreasing the distance between tuning circuits 22, thus multiplying the effect of the phase delay of each tuning circuit 22; 2) operating at a frequency where the amplifier Q1 has a larger positive phase shift, and/or 3) designing the tuning circuit 22 to achieve a broader range of reactances, according to embodiments of this presentation.

EMSADA Embodiments

An antenna according to embodiments of this presentation can also be an Electronically-scanned Modulated Stripline Antenna with Distributed Amplification (EMSADA). As detailed hereafter with respect to FIGS. 12A-12C, an antenna according to an embodiment of this presentation can be modified from a stripline having a center conductor that is sandwiched in a dielectric substrate between two ground conductors. According to an embodiment of this presentation, the antenna can be modified from a stripline to include tuning circuits and amplifiers to provide beam scanning and distributed amplification.

Figure 13A:
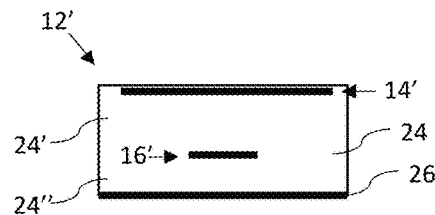
FIGS. 13A-13C respectively show front, side, and top views of an antenna, according to an embodiment of this presentation.
Figure 13B:
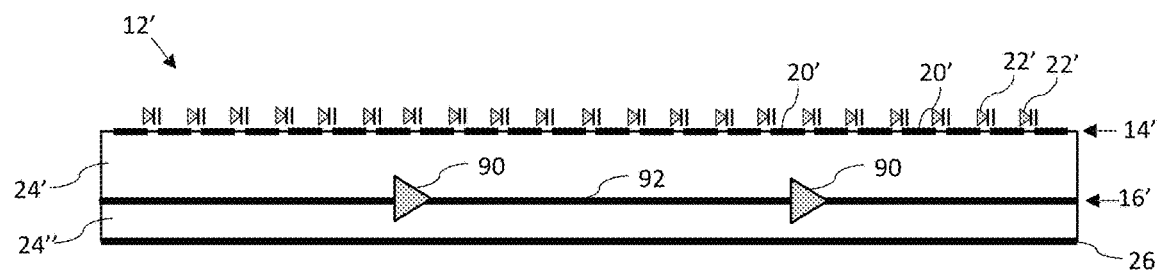
Figure 13C:
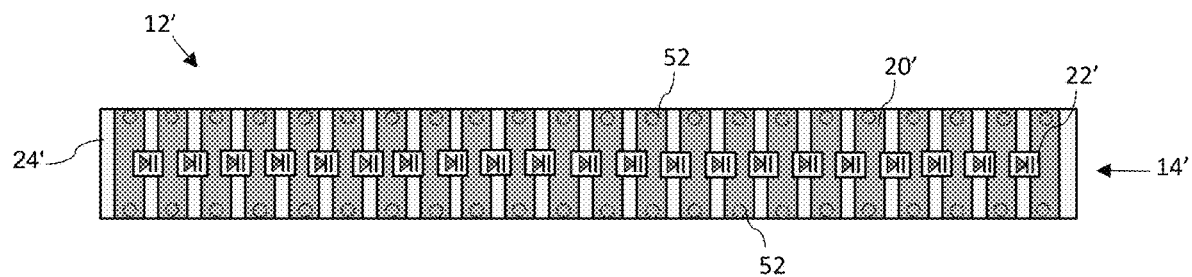

FIGS. 13A-13C respectively show front, side, and top views of an antenna 12', which can comprise a travelling wave guiding structure having a bottom conductor 26 and a top conductor 14' developing each along a first direction, according to an embodiment of this presentation. As shown in FIGS. 13B and 13C, the top conductor 14' can comprise a plurality of first conductive patches 20' arranged periodically along said first direction and connected in series by tuning circuits 22'. The first conductive patches 20' can have any suitable shape, including rectangular, square, circular, etc. According to an embodiment of this presentation, each patch can be loaded with one or more circuits 22'. The first conductive patches 20' can be metallic patches, according to an embodiment of this presentation.

According to an embodiment of this presentation, the tuning circuits 22' can have a tunable reactance. The tunable reactance can be a tunable capacitance, according to an embodiment of this presentation. According to an embodiment of this presentation, the tuning circuit 22' can comprise a varactor diode, a PIN diode, and/or a Schottky diode. According to an embodiment of this presentation, the tuning circuit 22' can comprise a single varactor diode, a single PIN diode, and/or a single Schottky diode. According to embodiments of this presentation, a tuning circuit 22' can be identical to a tuning circuit 22 as detailed above.

According to an embodiment of this presentation the top conductor 14' (e.g., the first conductive patches 20') can be loaded with the tuning circuits 22' to form an impedance sheet such as, for example, a modulated tensor impedance sheet or an artificial impedance sheet.

As shown in FIG. 13B, the antenna 12' can comprise a plurality of amplifiers 90 arranged for compensating resistive and radiation losses along the length of the travelling wave guiding structure. According to an embodiment of this presentation, each of said plurality of amplifiers 90 can be connected between two consecutive second conductive patches 92. According to an embodiment of this presentation, the second conductive patches 92 can be periodically arranged along said first direction on a plane located between the bottom conductor 26 and top conductor 14'.

According to an embodiment of this presentation, and as shown in FIGS. 13A and 13B, the antenna 12' can comprise a center conductor 16' developing along the first direction on the plane located between the bottom 26 and top 14' conductors, the center conductor 16' comprising the second conductive patches 92. According to an embodiment of this presentation, the second conductive patches 92 can be connected in series by the amplifiers 90. According to an embodiment of this presentation, the amplifiers 90 can be periodically loaded to the center conductor 16'. According to an embodiment of this presentation, the amplifiers 90 can provide a negative resistance periodically loaded to the center conductor 16'.

According to an embodiment of this presentation, the amplifiers 90 can improve aperture efficiency and radiated power by compensating for losses in the tuning circuits 22' and losses due to radiation. By spreading the amplifiers 90 across the antenna 12' and along the plane located between the top 14' and bottom 26 conductors, the antenna 12' can radiate more uniformly across the aperture. To maintain a beam direction, the amplifiers 90 preferably do not disturb the phase of a travelling electromagnetic wave. According to an embodiment of this presentation, the amplifiers 90 are preferably negative resistance amplifiers 90. According to an embodiment of this presentation, the amplifiers preferably have a near zero reactance. Suitable amplifiers 90 can include negative impedance converters (NIC), negative impedance inverters (NII), Gunn diodes (a two-terminal semiconductor electronic component, with negative resistance), tunnel diodes (achieves "negative resistance" due to a quantum mechanical effect), IMPact ionization Avalanche Transit-Time (IMPATT) diodes, and/or operational amplifiers. According to an embodiment of this presentation, the amplifiers 90 can have a tunable negative resistance, which can include amplifiers 90 such as, for example NICs and/or NIIs.

According to an embodiment of this presentation, the antenna 12' can be referred to as a loaded stripline, for example, because the antenna 12' can be a stripline loaded with the tuning circuits 22' and the amplifiers 90.

As shown in FIGS. 13A and 13B, according to an embodiment of this presentation, the antenna can comprise a first dielectric layer 24" that supports the second conductive patches 92 above the bottom conductor 26, and a second dielectric layer 24' wherein the second dielectric layer 24' supports the top conductor 14' above the second conductive patches 92. According to an embodiment of this presentation, the second dielectric layer 24' can be placed above the center conductor 16', and the first dielectric layer 24" can be placed below the center conductor 16'. According to an embodiment of this presentation, the first 24" and second 24' dielectric layers can comprise different dielectric materials. According to an embodiment of this presentation, and as shown in FIG. 13A, the first 24" and second 24' dielectric layers can respectively be first 24" and second 24' dielectric layers of a dielectric substrate 24. According to an embodiment of this presentation, the center conductor 16' can be positioned in the dielectric substrate 24. According to an embodiment of this presentation, the amplifiers 90 can be embedded in the dielectric substrate 24.

According to an embodiment of this presentation, the antenna 12' can comprise a biasing and control network (detailed hereafter) to power the amplifiers 90 and to bias the tuning circuits 22' with the desired modulation.

According to an embodiment of this presentation, to isolate the antenna 12' from external signals which may interfere with the antenna 12', the top 14' and bottom 26 conductors can be radio frequency short circuited (e.g., on the outside of the travelling wave guiding structure) along the length of the antenna 12'. According to an embodiment of this presentation, and as shown in FIG. 13C, the top 14' and bottom 26 conductors can be radio frequency short circuited by forming an array of vertical conductive vias 52 electrically connecting the top conductor 14' to the bottom conductor 26 along the length of the antenna. According to an embodiment of this presentation, the vertical conductive vias 52 can comprise, for example, capacitors, wherein the top conductor 14' can be electrically connected to the bottom conductor 26 via the capacitors of the vertical conductive vias 52. According to an embodiment of this presentation, and as shown, the conductive patches 20' of the top conductor 14' can be electrically connected to the bottom conductor 26 via the capacitors of the vertical conductive vias 52. Each capacitor can form a short circuit at radio frequencies and an open circuit at 0 Hz, according to an embodiment of this presentation.

Figure 12A:
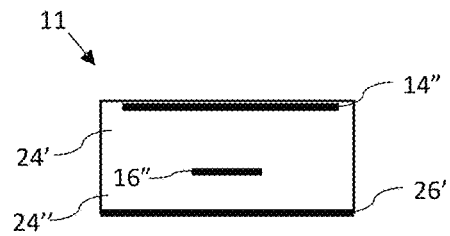
FIGS. 12A-12C respectively show front, side, and top views of a stripline, according to an embodiment of this presentation.
Figure 12B:
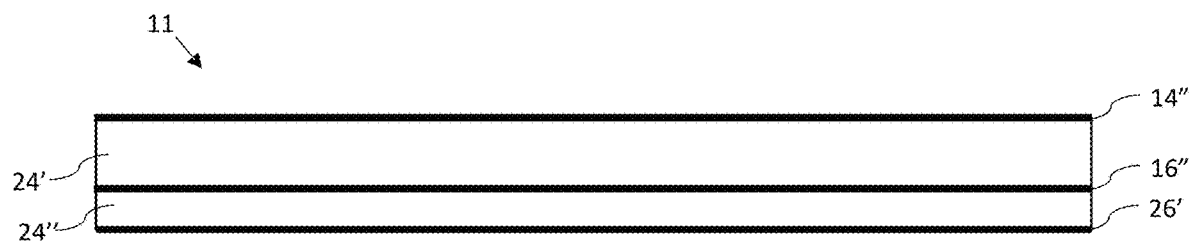
Figure 12C:
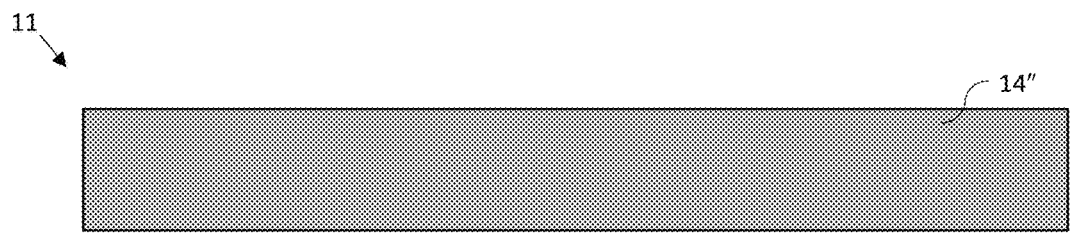

For ease of reference, FIGS. 12A-12C respectively show front, side, and top views of a stripline 11 comprising a top conductor 14" and a bottom conductor 26' developing each along a first direction. The stripline 11 further comprises a center conductor 16" developing along the first direction on a plane located between the bottom 26' and top 14" conductors. As shown in FIGS. 12A and 12B, the stripline 11 comprises a first dielectric layer 24" that supports the center conductor 16" above the bottom conductor 26', and a second dielectric layer 24' wherein the second dielectric layer 24' supports the top conductor 14" above the center conductor 16". As shown, the stripline 11 does not comprise any amplifiers (e.g., 90 shown in FIG. 13B). As shown, the stripline 11 does not comprise any tuning circuits (e.g., 22' shown in FIG. 13B).

According to an embodiment of this presentation, the antenna 12' shown in FIGS. 13A-13C can be formed by modifying a stripline such as shown in FIGS. 12A-12C, for example, by modifying the top conductor 14" of the stripline 11 to form the top conductor 14', and by modifying the center conductor 16" of the stripline 11 to form the center conductor 16'.

Figure 14:
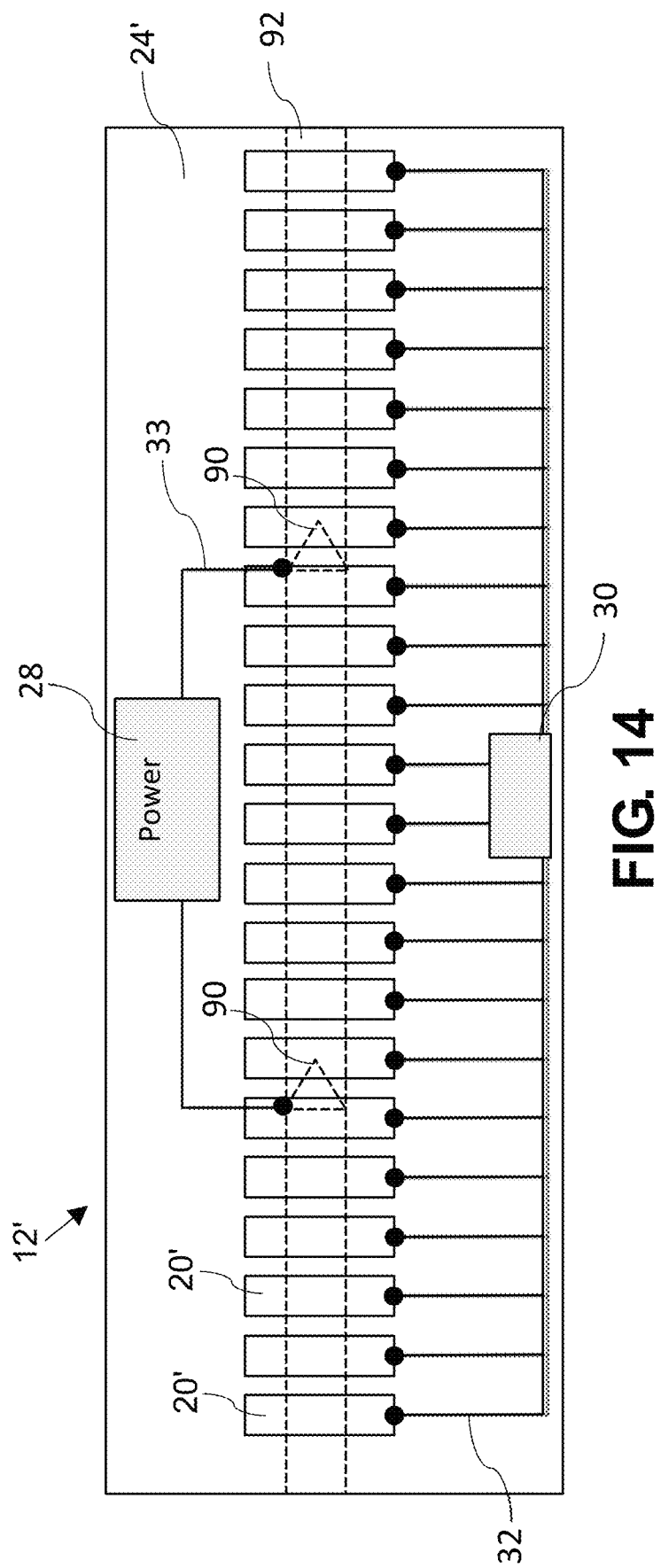
FIG. 14. shows a top view of the antenna shown in FIGS. 13A-13C, further comprising a biasing and control network, according to an embodiment of this presentation.

FIG. 14 shows a top view of the antenna 12', according to an embodiment of this presentation, further comprising a biasing and control network which can include a power supply 28, and a digital-to-analog converter (DAC) 30. In FIG. 14, the second conductive patches 92 and the amplifiers 90 are drawn with dashed lines to indicate portions of the patches 92 and the amplifiers 90 that can be covered by the second dielectric layer 24', according to an embodiment of this presentation. According to an embodiment of this presentation, the power supply 28 can be electrically connected to the amplifiers 90 via first electrical connections 33. According to an embodiment of this presentation, the power supply or controller 28 can provide a voltage source to the amplifiers 90. By changing the voltage provided to the amplifiers 90, the gain of the amplifiers 90 can be tuned (by e.g. changing a negative resistance in a negative resistance amplifier). According to an embodiment of this presentation, the DAC 30 can be electrically connected to the first conductive patches 20' via second electrical connections 32. The DAC 30 can set a respective voltage to each of the first conductive patches 20', which can tune the reactance of the tuning circuits (e.g., 22' shown in FIGS. 13B and 13C). According to an embodiment of this presentation, the DAC 30 can apply different voltages to the different first conductive patches 20'. According to an embodiment of this presentation, and as shown, the power supply 28 and DAC 30 can be positioned on the second dielectric layer 24'. However, in other embodiments, the power supply 28 and the DAC 30 can be positioned on a separate circuit board (not shown) or be positioned behind the ground plane on a different dielectric layer or substrate (not shown).

According to an embodiment of this presentation, the radiation pattern of the antenna 12' can be adjusted by using the DAC 30 to set the modulation period of the tuning circuits 22' as, for example, the modulation period p in Eq. 2, and detailed more hereafter. The radiated beam can be scanned in the forward and/or backward direction, according to an embodiment of this presentation. According to embodiments of this presentation, each patch can be brought to an independent voltage and these voltages are varied along the antenna to cause the antenna to scan forward and backward.

Figure 15:
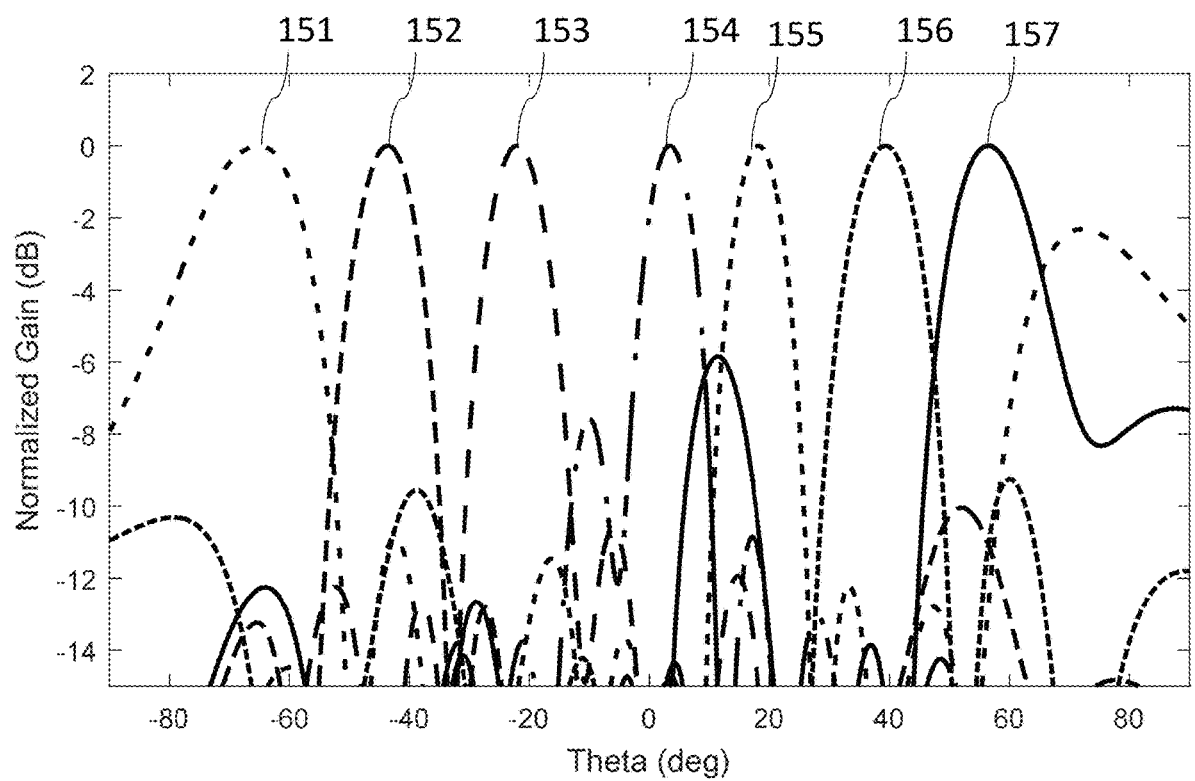
FIG. 15 graphically shows a simulation of a normalized radiation pattern of an antenna being scanned from −60 degrees to +60 degrees with respect to normal of the antenna, according to an embodiment of this presentation.

FIG. 15 graphically shows a simulation of a normalized radiation pattern of an antenna (e.g., 12' shown in FIGS. 13A-13C) being scanned from −60 degrees to +60 degrees with respect to normal of the antenna, according to an embodiment of this presentation, the antenna comprising three amplifiers (e.g., 90 shown in FIGS. 13B and 14)

equally spaced along the center conductor (e.g., 16' shown in FIGS. 13A and 13B) of the antenna, the amplifiers each having a negative resistance R=−20D. Curves 151, 152, 153, 154, 155, 156, and 157 respectively correspond to periodic modulation periods (e.g., p in Eq. 2) 4.2 mm, 4.7 mm, 5.6 mm, 6.7 mm, 8.6 mm, 11.7 mm, and 15.8 mm, where for each curve, the operation frequency is fixed at 30 GHz, and the average mode index is 1.5. Curves 151-157 show that the direction of a beam radiated from the antenna can be changed by modifying the modulation period p. The modulation period can be the distance by which a series of different voltages applied to the different first conductive patches (e.g., 20' shown in FIGS. 13B and 13C) repeats along the length of the antenna (e.g., 12' shown in FIGS. 13A-13C), according to an embodiment of this presentation. According to an embodiment of this presentation, the modulation period can be the distance by which a series of reactances and/or capacitances of the tuning circuits (e.g., 22' in FIGS. 13B and 13C) repeats along the length of the antenna.

According to an embodiment of this presentation, the ELADA does not necessarily require negative resistance amplifiers. However, because the tuning circuits of the ELADA preferably comprise amplifiers, each tuning circuit may be more complicated than those of the EMSADA. In the ELADA, if each tuning circuit comprises an amplifier, the amplifiers are preferably loaded at subwavelength periodicity; subwavelength spacing of the amplifiers can make the antenna sensitive to the performance of the amplifiers, and so can lead to instability. According to an embodiment of this presentation, a portion of the tuning circuits can comprise amplifiers so that the amplifiers are separated by a distance that is larger than subwavelength.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this presentation with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Reference to the word "comprising" is not necessarily intended to mean "consisting of" unless explicitly so stated. Moreover, no element, component, nor method or process step in this presentation is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . . "

What is claimed is:

1. An electronically scanned antenna comprising:
a travelling wave guiding structure having a bottom conductor and a top conductor developing each along a first direction, the top conductor comprising a plurality of first conductive patches arranged periodically along said first direction and connected in series by tuning circuits for electronically changing a radiation angle of the electronically scanned antenna;
the electronically scanned antenna further comprising a plurality of amplifiers arranged for compensating resistive and radiation losses along the length of the travelling wave guiding structure.

2. The electronically scanned antenna of claim 1, wherein each of said plurality of amplifiers is included within each of said tuning circuits.

3. The electronically scanned antenna of claim 2, wherein the antenna is provided for guiding a travelling wave having a predetermined wavelength and wherein the distance between two consecutive first conductive patches along said first direction is sub-wavelength.

4. The electronically scanned antenna of claim 2, wherein each of said tuning circuits is provided to introduce a variable phase delay and a variable gain between the first conductive patches it connects.

5. The electronically scanned antenna of claim 4, wherein each of said tuning circuits comprises a varactor diode arranged to introduce said variable phase delay, and a common emitter amplifier arranged to introduce said variable gain; said varactor diode being connected in series with said common emitter amplifier.

6. The electronically scanned antenna of claim 4, arranged such that varying said variable phase delay changes a radiation angle of the antenna, and wherein said variable gain is arranged to maintain a 0 dB gain across the entire travelling wave guiding structure.

7. The electronically scanned antenna of claim 2, further comprising a biasing and control network arranged to operate the amplifier and tuning circuits.

8. The electronically scanned antenna of claim 7, wherein said bottom conductor is connected to a ground and wherein said biasing and control network is arranged below the bottom conductor.

9. The electronically scanned antenna of claim 1, wherein a dielectric layer supports the top conductor above the bottom conductor.

10. The electronically scanned antenna of claim 1, wherein each of said plurality of amplifiers is connected between two consecutive second conductive patches, the second conductive patches being periodically arranged along said first direction on a plane located between the bottom and top conductors.

11. The electronically scanned antenna of claim 10, wherein the antenna is provided for guiding a travelling wave having a predetermined wavelength, wherein:
the distance between two consecutive first conductive patches along said first direction is sub-wavelength; and the distance between two consecutive second conductive patches along said first direction is larger than the distance between two consecutive first conductive patches along said first direction.

12. The electronically scanned antenna of claim 10, wherein each of said tuning circuits is provided to introduce a variable phase delay between the first conductive patches it connects and wherein each amplifier is provided to introduce a variable gain between the second conductive patches it connects.

13. The electronically scanned antenna of claim 12, wherein each of said tuning circuits comprises a varactor diode arranged to introduce said variable phase delay.

14. The electronically scanned antenna of claim 12, wherein each of said plurality of amplifiers comprises a negative impedance amplifier arranged to introduce said variable gain.

15. The electronically scanned antenna of claim 12, arranged such that varying said variable phase delay changes a radiation angle of the antenna, wherein said variable gain is arranged to maintain a 0 dB gain across the entire travelling wave guiding structure.

16. The electronically scanned antenna of claim 10, wherein a first dielectric layer supports the second conductive patches above the bottom conductor and wherein a second dielectric layer supports the top conductor above the second conductive patches.

17. The electronically scanned antenna of claim 10, further comprising a biasing and control network configured to operate the antenna, tuning circuits, and amplifiers.

18. The electronically scanned antenna of claim 17, wherein said bottom conductor is connected to a ground and wherein said biasing and control network is disposed below the bottom conductor.

19. The antenna of claim 10, wherein the amplifiers comprise an negative impedance converter (NIC), a negative impedance inverter (NII), a Gunn diode, a tunnel diode, an IMPact ionization Avalanche Transit-Time (IMPATT) diode, or an operational amplifier.

20. The antenna of claim 10, comprising two second conductive patches, wherein each of the plurality of amplifiers comprises one amplifier.

* * * * *